United States Patent
Ge

(10) Patent No.: US 12,430,045 B2
(45) Date of Patent: Sep. 30, 2025

(54) DYNAMIC INTERVAL FOR A MEMORY DEVICE TO ENTER A LOW POWER STATE

(71) Applicant: Micron Technology, Inc., Boise, ID (US)

(72) Inventor: Liang Ge, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 47 days.

(21) Appl. No.: 17/597,475

(22) PCT Filed: Dec. 18, 2020

(86) PCT No.: PCT/CN2020/137528
§ 371 (c)(1),
(2) Date: Jan. 6, 2022

(87) PCT Pub. No.: WO2022/126578
PCT Pub. Date: Jun. 23, 2022

(65) Prior Publication Data
US 2022/0398024 A1    Dec. 15, 2022

(51) Int. Cl.
*G06F 3/06* (2006.01)
(52) U.S. Cl.
CPC .......... *G06F 3/0625* (2013.01); *G06F 3/0619* (2013.01); *G06F 3/0659* (2013.01); *G06F 3/0679* (2013.01)
(58) Field of Classification Search
CPC ..... G06F 3/0625; G06F 3/0619; G06F 3/0659
USPC ....................................................... 711/154
See application file for complete search history.

(56) References Cited

U.S. PATENT DOCUMENTS

| | | | | |
|---|---|---|---|---|
| 11,080,188 | B1 * | 8/2021 | Tong | G06F 12/1009 |
| 2013/0151755 | A1 * | 6/2013 | Elhamias | G06F 3/0679 |
| | | | | 711/E12.008 |
| 2014/0149759 | A1 * | 5/2014 | Conrad | G06F 1/3228 |
| | | | | 713/320 |
| 2014/0258225 | A1 * | 9/2014 | Bovee | G06F 13/385 |
| | | | | 707/613 |

(Continued)

FOREIGN PATENT DOCUMENTS

| CN | 101299349 A | 11/2008 |
|---|---|---|
| CN | 101963837 A | 2/2011 |

(Continued)

OTHER PUBLICATIONS

ISA/CN, "International Search Report and Written Opinion of the International Searching Authority," issued in connection with Int'l Appl. No. PCT/CN2020/137528, dated Sep. 24, 2021 (9 pages).

*Primary Examiner* — Gautam Sain
(74) *Attorney, Agent, or Firm* — Holland & Hart LLP

(57) ABSTRACT

Methods, systems, and devices for a dynamic interval for entering a low power state are described. A memory system or device may support a low power mode, which the memory system or device may enter in response to a command from a host system. In some cases, an amount of idle time observed by the host system before issuing such a command may vary based on a status of maintenance operations for the memory system or device. Additionally or alternatively, after receiving such a command, the memory system or device may complete one or more pending maintenance operations before entering the low power mode.

15 Claims, 8 Drawing Sheets

(56) References Cited

U.S. PATENT DOCUMENTS

| | | | | |
|---|---|---|---|---|
| 2015/0012671 A1* | 1/2015 | Park | ................ | G06F 13/00 |
| | | | | 713/323 |
| 2015/0363120 A1* | 12/2015 | Chen | ................ | G06F 3/0619 |
| | | | | 711/103 |
| 2017/0109101 A1* | 4/2017 | Hanson | ................ | G06F 3/0685 |
| 2018/0157417 A1* | 6/2018 | Shih | ................ | G06F 3/0634 |
| 2019/0179747 A1* | 6/2019 | Kim | ................ | G06F 12/0246 |
| 2019/0303024 A1* | 10/2019 | Iwai | ................ | G06F 3/061 |
| 2020/0042207 A1* | 2/2020 | Kwak | ................ | G06F 3/0634 |
| 2020/0209944 A1* | 7/2020 | Palmer | ................ | G06F 9/3836 |
| 2021/0405892 A1* | 12/2021 | Bonen | ................ | G11C 11/40615 |
| 2022/0012172 A1* | 1/2022 | Ostrovsky | ................ | G06F 12/0246 |

FOREIGN PATENT DOCUMENTS

| | | |
|---|---|---|
| CN | 108604114 A | 9/2018 |
| CN | 109983423 A | 7/2019 |

\* cited by examiner

DYNAMIC INTERVAL FOR A MEMORY DEVICE TO ENTER A LOW POWER STATE

CROSS REFERENCE

The present application for patent is a 371 national phase filing of International Patent Application No. PCT/CN2020/137528 by GE, entitled "DYNAMIC INTERVAL FOR A MEMORY DEVICE TO ENTER A LOW POWER STATE," filed Dec. 18, 2020, assigned to the assignee hereof, and expressly incorporated by reference herein.

FIELD OF TECHNOLOGY

The following relates generally to one or more systems for memory and more specifically to a dynamic interval for entering a low power state.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), 3-dimensional cross-point memory (3D cross point), not-or (NOR), and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

Figure 1:
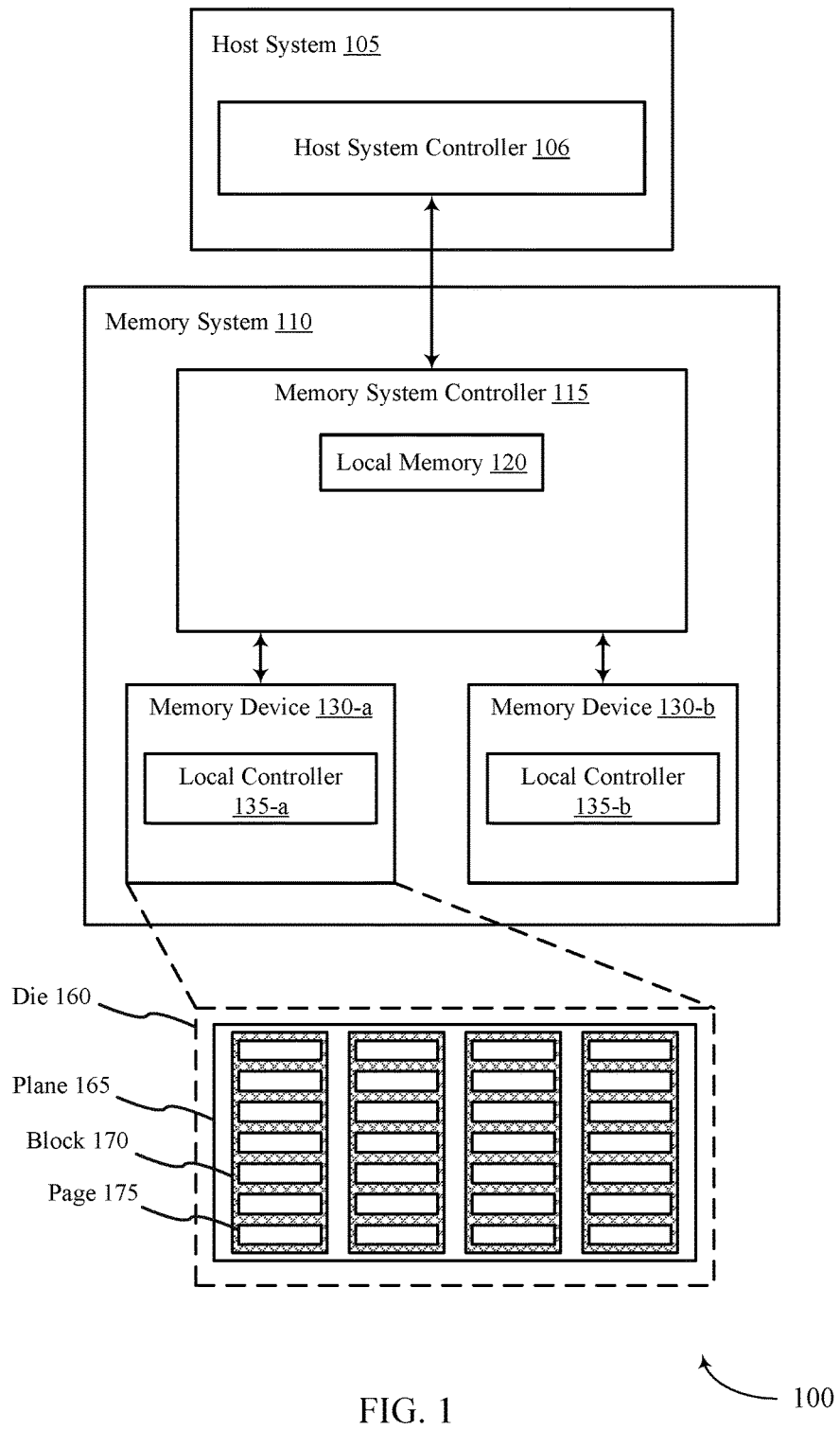
FIG. 1 illustrates an example of a system that supports a dynamic interval for entering a low power state in accordance with examples as disclosed herein.

To conserve power or other resources, a memory device may at some times operate in a low power mode, which may alternatively be referred to as a hibernate mode or sleep mode, among other possibilities. While operating in the low power mode, the memory device may conserve less power relative to another operating mode, such as another mode in which the memory device may actively receive and execute commands from a host system, for example. In some cases, a memory device may enter or exit the low power mode in response to corresponding commands from the host system. For example, after some amount of idle time (e.g., time without commands or other signaling being issued or identified to be issued to the memory device by the host system), the host system may transmit a hibernate command to the memory device, in response to which the memory device may enter the low power mode. In some cases, the hibernate command may alternatively be referred to as an enter hibernate command, among other possible names. The memory device may exit the lower power mode in response to an exit hibernate or other command issued by the host system.

As described herein, a memory device may perform various maintenance operations, which may alternatively be referred to as background operations, among other possibilities. Maintenance operations may include refresh operations, garbage collection operations, diagnostic or other evaluations related to memory device performance or conditions, or the like. For example, at least some maintenance operations may not be in response to commands from the host system but may instead be performed on a periodic or as-needed basis as determined by the memory device or a controller within a memory system that includes the memory device.

The quantity of pending maintenance operations, the urgency of pending maintenance operations, or both may vary over time for a memory device. For example, the more time that passes without the memory device performing maintenance operations, the more maintenance operations may be pending for the memory device. In some cases, a memory device for which a relatively large quantity maintenance operations are pending, one or more particularly urgent maintenance operations are pending, or both, may be referred to as "dirty," while a memory device for which relatively few maintenance operations are pending, for which any pending maintenance operations are not urgent, or both, may be referred to as "clean." How dirty a memory device is may in some cases be referred to as a dirty level or dirty status for the memory device.

In some cases, a memory device may perform maintenance operations when not performing other operations (e.g., read operations, write operations) in response to commands form a host system. For example, the memory device may begin to perform pending maintenance operations after some amount of time without receiving a command or other signaling form a host system. If, however, the memory device receives a hibernate command from the host system, the memory device may cease (or not begin) performing maintenance operations—instead, the memory device may enter into the low power mode. Thus, for example, if a memory device is relatively dirty and receives a hibernate command before completing one or more pending maintenance operations, the memory device may enter the low power mode before completing the one or more pending maintenance operations, which may increase the latency with which such maintenance operations are completed or otherwise adversely impact memory device performance.

To mitigate such effects, as described herein, a host system may use a variable (e.g., dynamic, not fixed) interval to determine whether to issue a hibernate command to a memory device. For example, the host system may observe more idle time before issuing a hibernate command when memory device is relatively dirty than when the memory device is relatively clean. The host system may identify the dirty status of the memory device, for example, based on an indication received from the memory device. As one example, the host system may issue a hibernate command based on the expiration of a timer, where the timer reflects an amount of time since the issuance of a preceding command (e.g., a preceding access command). If the memory device is relatively dirty the host system may set the duration of the timer to be relatively high. Conversely, if the memory device is relatively clean the host system may set the duration of the timer to be relatively low.

Additionally or alternatively, a memory device may receive a hibernate command but complete any pending or particularly urgent maintenance operations before entering the low power mode in response to the hibernate command. For example, in response to the hibernate command from a host system or a prior determination by the memory device, the memory device may switch into an intermediate power mode in which the memory device may perform maintenance operations, and the memory device may complete some or all of the pending maintenance operations before entering the low power mode. In some cases, either in response to the hibernate command or at some other time, the memory device may indicate to the host system a duration of time required (e.g., that will be required after receipt of a hibernate command) for the memory device to complete one or more maintenance operations before entering the low power mode.

The teachings herein may support a memory device performing maintenance operations with lower latency, among other benefits that may be appreciated by one of ordinary skill in the art. Further, power consumption or other aspects of memory device performance may not be adversely impacted as no additional maintenance operations need be performed—rather, those that are performed may merely be performed sooner in time.

Features of the disclosure are initially described in the context of a system as described with reference to FIG. 1. Features of the disclosure are described in the context of process flow diagrams as described with reference to FIGS. 2 and 3. These and other features of the disclosure are further illustrated by and described with reference to an apparatus diagram and flowcharts that relate to a dynamic interval for entering a low power state as described with reference to FIGS. 4-8. Though some examples herein may be described with reference to a non-volatile memory device, such as a NAND memory device, one of ordinary skill in the art will appreciate that the teachings herein may be applied in the context of any type of memory device comprising any type of memory cells.

FIG. 1 is an example of a system 100 that supports a dynamic interval for entering a low power state in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a control component configured to cause the host system 105 to perform various operations in accordance with examples as described herein. The host system 105 may include one or more devices, and in some cases may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., PCIe controller, SATA controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may in some cases be configured to communicate via a physical host interface using an associated protocol (e.g., to exchange or otherwise communicate control, address, data, and other signals between the memory system 110 and the host system 105). Examples of a physical host interface may include, but are not limited to, a serial advanced technology attachment (SATA) interface, a UFS interface, an eMMC interface, a peripheral component interconnect express (PCIe) interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

Memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, where memory system 110 includes more than one memory device 130, different memory devices 130 within memory system 110 may include the same or different types of memory cells.

The memory system controller 115 may be coupled with and communicate with the host system 105 (e.g., via the physical host interface), and may be an example of a control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130, and other such operations, which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. And in some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored in the local memory 120 when read from or written to a memory device 130, and may be available within the local memory 120 for subsequent retrieval for or manipulation (e.g., updating) by the host system 105 (e.g., with reduced latency relative to a memory device 130) in accordance with a cache policy.

Although the example of memory system 110 in FIG. 1 has been illustrated as including the memory system controller 115, in some cases, a memory system 110 may not include a memory system controller 115. For example, the memory system 110 may additionally or alternatively rely upon an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may in some cases instead be performed by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric RAM (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), and electrically erasable programmable ROM (EEPROM). Additionally or alternatively, a memory device 130 may include one or more arrays of volatile memory cells. For example, a memory device 130 may include random access memory (RAM) memory cells, such as dynamic RAM (DRAM) memory cells and synchronous DRAM (SDRAM) memory cells.

In some examples, a memory device 130 may include (e.g., on a same die or within a same package) a local controller 135, respectively, which may execute operations on one or more memory cells of the memory device 130. A local controller 135 may operate in conjunction with a memory system controller 115 or may perform one or more functions ascribed herein to the memory system controller 115.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, performing concurrent operations in different planes 165 may be subject to one or more restrictions, such as identical operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may in some cases not be updated until the entire block 170 that includes the page 175 has been erased.

In some cases, a memory system controller 115 or a local controller 135 may perform maintenance operations (e.g., as part of one or more media management algorithms) for a memory device 130, such as wear leveling, background refresh, garbage collection, scrub, block scans, health monitoring, or others, or any combination thereof. For example, within a memory device 130, a block 170 may have some pages 175 containing valid data and some pages 175 containing invalid data. To avoid waiting for all of the pages 175 in the block 170 to have invalid data in order to erase and reuse the block 170, an algorithm referred to as "garbage collection" may be invoked to allow the block 170 to be erased and released as a free block for subsequent write operations. Garbage collection may refer to a set of media management operations that include, for example, selecting a block 170 that contains valid and invalid data, selecting pages 175 in the block that contain valid data, copying the valid data from the selected pages 175 to new locations (e.g., free pages 175 in another block 170), marking the data in the previously selected pages 175 as invalid, and erasing the selected block 170. As a result, the number of blocks 170 that have been erased may be increased such that more blocks 170 are available to store subsequent data (e.g., data subsequently received from the host system 105).

In some cases, the memory system controller 115 or a corresponding local controller 135 may indicate a state of maintenance operations for a memory device 130 (e.g., a dirty level or status of the memory device 130) to the host system 105. For example, the memory system controller 115 corresponding local controller 135 may indicate a quantity of maintenance operations and/or an urgency of maintenance operations to be performed on the memory device 130-*a*, or may indicate a dirty level (e.g., one of a set of dirty levels) that may be based on one or more such factors.

The host system 105 may issue a hibernate command to a memory device 130, which may cause the memory device 130 to enter into a low power state or mode (e.g., a hibernate mode). For example, when the memory device 130 is idle for a duration (e.g., when the host system 105 has not transmitted any commands to the memory device 130 for the duration), the host system 105 may issue a hibernate command to the memory device 130 to conserve power or other resources of the system 100. In some cases, as described herein, the host system 105 may set a duration of the timer for issuing hibernate commands based on the state of the maintenance operations for the memory device 130 (or for the memory system 110, such as for multiple memory devices 130 within the memory system 110). For example, the host system 105 may set the duration of a timer to be longer when the memory device 130 is relatively more dirty and shorter when the memory device 130 is relatively less dirty. Additionally or alternatively, the memory device 130 may delay entering into a hibernate mode after receiving a hibernate command in order to perform one or more pending maintenance operations.

By setting the duration of a timer for issuing hibernate commands based on the state of maintenance operations for a memory device 130, or by the memory device delaying entering into the hibernate mode after receiving a hibernate command in order to perform one or more pending maintenance operations, or both, all or at least an increased quantity of the maintenance operations (or a subset of urgent maintenance operations) may be performed on the memory device 130 before the memory device 130 enters into a low power state.

Accordingly, techniques as described herein may decrease the latency with which maintenance operations are performed on a memory device 130, which may improve other aspects of the operation of the memory device 130 or the system 100, among other benefits that may be appreciated by one of ordinary skill in the art.

The system 100 may include any quantity of non-transitory computer readable media that support a dynamic interval for entering a low power state. For example, the host system 105, the memory system controller 115, or a memory device 130 may include or otherwise may access one or more non-transitory computer readable media storing instructions (e.g., firmware) for performing the functions ascribed herein to the host system 105, memory system controller 115, or memory device 130. For example, such instructions, when executed by the host system 105 (e.g., by the host system controller 106), by the memory system controller 115, or by a memory device 130 (e.g., by a local controller 135), may cause the host system 105, memory system controller 115, or memory device 130 to perform one or more associated functions as described herein.

Figure 2:
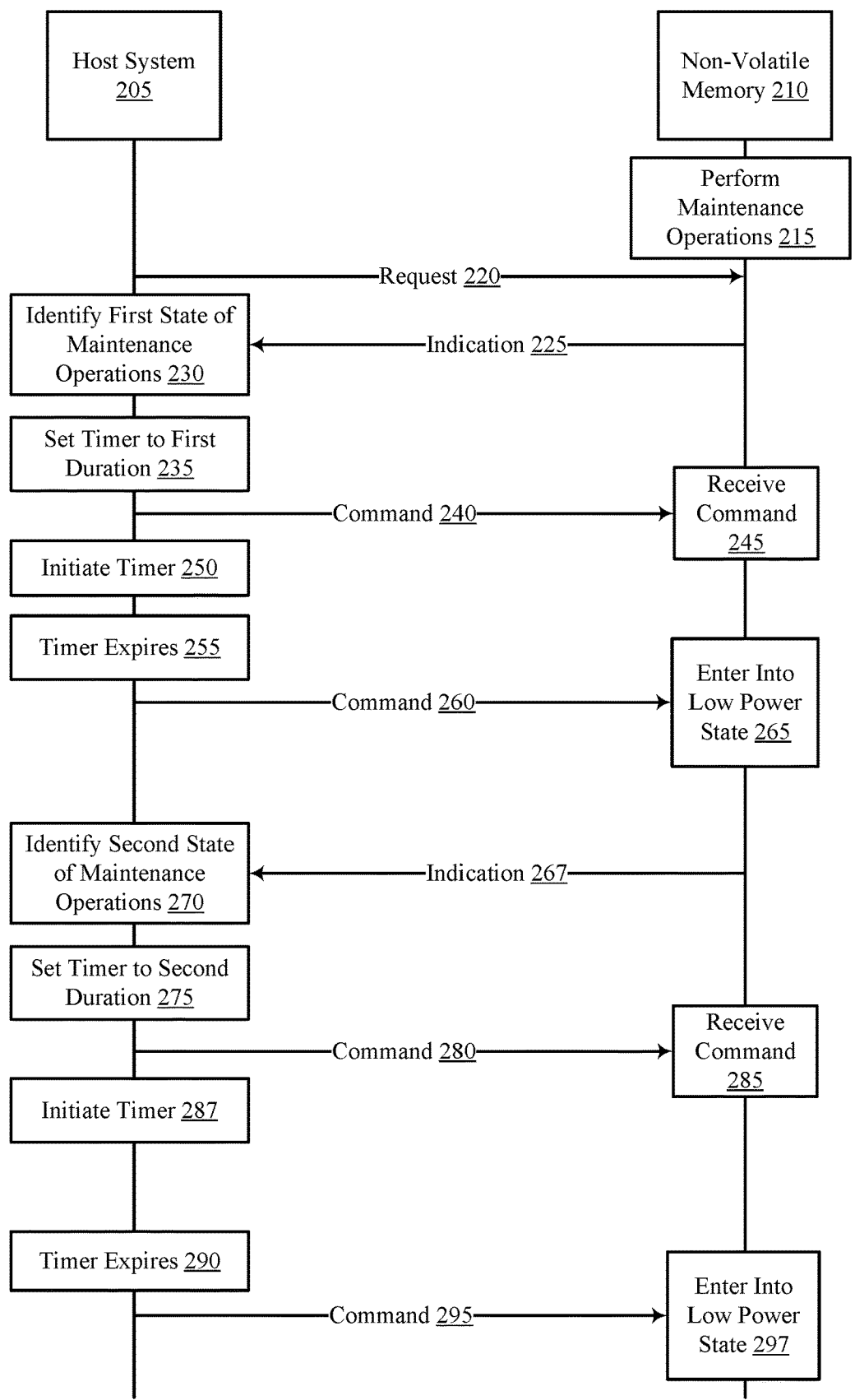
FIGS. 2 and 3 illustrate examples of process flow diagrams that support a dynamic interval for entering a low power state in accordance with examples as disclosed herein.

FIG. 2 illustrates an example process flow diagram 200 that supports a dynamic interval for entering a low power state in accordance with examples as disclosed herein. The process flow diagram 200 may illustrate operations performed at or by a host system 205, which may be an example of a host system 105 as described with reference to FIG. 1, and a non-volatile memory 210, which may be an example of a memory system 110 or memory device 130 as described with reference to FIG. 1.

As illustrated in FIG. 2, the host system 205 may be configured to transmit a command (e.g., a hibernate command) to enter the non-volatile memory 210 into a low power state (e.g., into a hibernate state, a hibernate mode). The host system 205 may be configured to issue the hibernate command at an interval (e.g., a variable interval, a dynamic interval) that is based on a state of maintenance operations being performed on the non-volatile memory 220. By issuing the hibernate command at a variable interval, maintenance operations being performed may be completed before the non-volatile memory 210 enters into a low power state, which may improve the overall efficiency and performance of the non-volatile memory 210.

At 215, one or more maintenance operations may be performed on the non-volatile memory 210. In some examples, a local controller of the non-volatile memory 210 may cause the memory device to perform the maintenance operations, while in other examples a memory system controller may cause the memory device to perform the maintenance operations. In other examples (not shown), maintenance operations may be performed at another time (e.g., a duration after receiving a command from the host system 205). As described herein, maintenance operations may include wear-leveling operations, garbage collection operations, error-correcting operations, encryption operations, caching operations, media management operations, background refresh operations, health monitoring operations, or address translations between logical addresses associated with commands from the host device and physical addresses of the non-volatile memory 210.

At 220, the host system 205 may transmit a request to the non-volatile memory 210. The request may be received by a local controller or by a memory system controller and may request an indication of the state of maintenance operations for the non-volatile memory 210. For example, the request transmitted by the host system 205 may request a quantity of pending maintenance operations, an urgency of one or more pending maintenance operations, or other information relating to maintenance operations for the non-volatile memory. In some instances, an urgency of pending maintenance operations may increase as a quantity of pending maintenance operations increases.

At 225, the non-volatile memory 210 (e.g., a local controller or an memory system controller associated with the non-volatile memory 210) may transmit an indication of the state of maintenance operations of the non-volatile memory 210 to the host system 205. The indication may allow for the host system 205 to dynamically set a duration of a timer that may be used for issuing a command to enter the non-volatile memory 210 into a low power state. In some examples, the non-volatile memory 210 may store an indication of the state of maintenance operations at a status register or other component. Additionally or alternatively, the non-volatile memory 210 may maintain (e.g., store) a queue of pending maintenance operations. The non-volatile memory 210 may determine the state of maintenance operations based on a quantity of pending maintenance operations, an urgency of one or more pending maintenance operations, or any combination thereof. For example, the indication may indicate a level corresponding to an associated scale (e.g., level one, level two, level three, and so on according to an associated dirty scale). In some cases, the urgency of pending maintenance operations may equivalent with or otherwise correlated with the quantity of pending maintenance operations (e.g., the more maintenance operations that are pending, the more urgent the maintenance operations may be).

At 230, the host system 205 may identify a state of maintenance operations of the non-volatile memory 210 (e.g., based on the indication received at 225). In some examples, the state of maintenance operations may relate to how "dirty" (or "clean") the non-volatile memory 220 is. For example, the host system 205 may identify that a relatively large quantity of maintenance operations are to be performed on the non-volatile memory 220, which may correspond to the non-volatile memory 220 being relatively "dirty." A relatively "dirty" device may require a longer duration to perform the pending maintenance operations in order to return the non-volatile memory 210 to a "clean" status. Conversely, a relatively small quantity of maintenance operations to be performed on the non-volatile memory 210 may correspond to the non-volatile memory being relatively "clean" (e.g., relatively less "dirty"). A relatively less "dirty" device may require a shorter duration to perform the pending maintenance operations. Accordingly, based on how dirty the non-volatile memory 210 is, the host system 205 may set a duration of a timer that may be used for issuing a command to enter the non-volatile memory 210 into a low power state.

At 235, the host system 205 may set a duration of a timer that may be used for issuing a command to enter the non-volatile memory 210 into a low power state. As described herein, the duration of the timer may be set based on a state of maintenance operations being performed on the non-volatile memory.

If a relatively large quantity of maintenance operations are yet to be performed on the non-volatile memory 210, the timer may be set to a relatively high duration in order for the maintenance operations (or a majority of the maintenance operations) to be completed before issuing a hibernate command. Conversely, for example, if a relatively small quantity of maintenance operations are yet to be performed on the non-volatile memory 210, the timer may be set a relatively low duration. For example, a duration of the timer may be set to 30 ms if a relatively large quantity of maintenance operations are to be performed on the non-volatile memory 210 (e.g., a level three on the above-described dirty scale), 20 ms if a medium quantity of maintenance operations are to be performed on the non-volatile memory 210 (e.g., a level two on the above-described dirty scale), or 10 ms if a relatively small quantity of maintenance operations are to be performed on the non-volatile memory 210 (e.g., a level one on the above-described dirty scale). It is to be understood that these and any other specific numbers or quantities used herein are solely for the sake of illustrative clarity and are not limiting.

As discussed herein, the duration to which a timer is set may be based on a level that corresponds to a state of maintenance operations of the non-volatile memory 210. Each level may correspond to a "dirtiness" of the non-volatile memory 210 (e.g., a quantity or a range quantity of maintenance operations to be performed on the non-volatile memory 210), and each level may be associated with a respective timer duration. The quantity of levels and the duration of the timer associated with each level may be a matter of design choice. No matter the duration of the timer, maintenance operations being performed on the non-volatile memory 210 will necessarily be completed (e.g., before entering the low power mode or after exiting the low power mode). Accordingly, setting the duration of the timer to allow for maintenance operations to be completed before entering the low power mode may improve the efficiency and overall performance of the non-volatile memory 210.

At 240, the host system 205 may issue a command to the non-volatile memory 210. The command may be, for example, an access command that is issued to access one or more memory cells of the non-volatile memory 210. In some examples (not shown), upon receiving the command, the non-volatile memory 210 (e.g., a local controller or an external memory controller associated with non-volatile memory 210) may initiate performing maintenance operations on the non-volatile memory 210. For example, maintenance operations may be initiated on the non-volatile memory 210 during an idle time after receiving the command. The non-volatile memory 210 may then enter the low power mode after receiving a subsequent command (e.g., a hibernate command). At 245, the non-volatile memory 210 (e.g., a local controller of the non-volatile memory 210 or an external memory controller associated with the non-volatile memory 210) may receive the command.

At 240, the host system 250 may initiate the timer based on issuing the command (e.g., at 237). As described herein, a duration of the timer may be set based on the state of the maintenance operations being performed on the non-volatile memory 210 (e.g., based on how "dirty" the non-volatile memory 210 is). For example, the duration of the timer may be longer or shorter based on how dirty the non-volatile memory 210 is. Additionally or alternatively, the expiration of the timer may result in the host system 205 issuing a command (e.g., a hibernate command) to enter the non-volatile memory 210 into a low power state. Because it may be desirable to enter the non-volatile memory 210 into a low power state based on an absence of commands transmitted (e.g., based on an absence of commands received by the non-volatile memory 210 for a duration), the timer may be reset (e.g., the timer may be reinitiated) each time a command is issued from the host system 205 before the timer expires. Accordingly, although FIG. 2 illustrates the timer being initiated one time at 250, the timer could be reinitiated any quantity of times before its expiration. At 255, the timer may expire based on an absence of commands being transmitted from the host system 205 to the non-volatile memory 210.

At 260, the host system 205 may issue a command (e.g., a hibernate command) to the non-volatile memory 210. As described herein, the hibernate command may be issued based on the expiration of the timer, and a duration of the timer may have been set based on a state of maintenance operations being performed on the non-volatile memory 210. Thus the hibernate command may be issued after a duration where no commands were communicated between the host system 205 and the non-volatile memory 210.

At 265, the non-volatile memory 210 (e.g., and its local controller or an associated external memory controller) may enter into the low power state based on receiving the hibernate command. Issuing the hibernate command after the duration may also have allowed for the non-volatile memory 210 to complete all pending maintenance operations or a particularly urgent subset thereof before entering the low power state at 265. As described herein, setting the duration of the timer to allow for maintenance operations to be completed before entering the low power mode may improve the efficiency and performance of the non-volatile memory 210.

In some examples (not shown), the non-volatile memory 210 may exit the low power state. For example, the non-volatile memory 210 may exit the low power state after a duration (e.g., a duration specified by the hibernate command), based on receiving one or more commands from the host system 205, or based on another condition or event. Additionally or alternatively, the non-volatile memory 210 may perform additional maintenance operations after exiting from the low power mode (not shown). The additional maintenance operations may be unrelated to the maintenance operations initiated at 222 and performed at 215, as those maintenance operations may have been completed before the non-volatile memory 210 entered into the low power state at 265.

At 270, the host system 205 may identify a second state of maintenance operations of the non-volatile memory 210. In some examples, the second state of maintenance operations identified at 270 may be different than the state of maintenance operations identified at 230 (e.g., may be based on an indication received at 267, which may be similar to the indication received at 225, but may reflect an updated state of maintenance operations). For example, at 270, the host system 205 may identify that larger quantity of maintenance operations are to be performed on the non-volatile memory 210 (e.g., than at 230). The host system 205 may identify the state of maintenance operations of the non-volatile memory 210 based on transmitting a request (such as the request transmitted at 220) and receiving an indication (such as the indication received at 225). Based on the state of maintenance operations of the non-volatile memory 210, the host system 205 may set a duration of a timer that may be used for issuing a command to enter the non-volatile memory 210 into a low power state.

At 275, the host system 205 may again set the duration of the timer that may be used for issuing a command to enter the non-volatile memory 210 into a low power state. In some instances the duration of the timer set at 275 may be different than the duration set at 235. For example, the duration of the timer set at 275 may be greater than the duration set at 235 due to the state of the maintenance operations of the non-volatile memory 210 being different. Despite the timer being set to a different duration at 275 than at 235, the duration may allow for maintenance operations performed on the non-volatile memory 210 to be completed before entering the low power mode, which may improve the efficiency and overall performance of the non-volatile memory 210.

At 280, the host system 205 may issue a command to the non-volatile memory 210. The command may be, for example, an access command that is issued to access one or more memory cells of the non-volatile memory 210. At 285, the non-volatile memory 210 (e.g., a local controller or a memory system controller associated with the non-volatile memory 210) may receive the command.

At 287, the host system 250 may initiate the timer based on issuing the command (e.g., at 280). As described herein, it may be desirable to enter the non-volatile memory 210 into a low power state based on an absence of commands communicated between the host system 205 and the non-volatile memory 210 (e.g., based on an absence of commands received by the non-volatile memory 210 for a duration). Accordingly, the timer may be reset (e.g., the timer may be reinitiated) each time a command is issued from the host system 205 before the timer expires. Although FIG. 2 illustrates the timer being initiated one time at 287, the timer could be reinitiated any quantity of times before its expiration. At 290, the timer may expire based on an absence of commands being transmitted from the host system 205 to the non-volatile memory 210.

At 295, the host system 205 may issue a command (e.g., a hibernate command) to the non-volatile memory 210. The hibernate command may be issued after a duration where no commands were communicated between the host system 205 and the non-volatile memory 210. A duration between 287 and 290 may be different than the duration between 250 and 255, and thus a duration between 240 and 260 may be different than the duration between 280 and 295, based on the timer being set to a different duration at 275 than at 235 (e.g., based on a different dirty level being indicated at 267 than at 230).

At 297, the non-volatile memory 210 (e.g., and a local controller internal to the non-volatile memory 210 or a memory system controller associated with the non-volatile memory 210) may enter into the low power state based on receiving the hibernate command. Issuing the hibernate command at 295 after the different duration may have allowed for the non-volatile memory 210 to complete all pending maintenance operations or a particularly urgent subset thereof before entering the low power state at 297. As described herein, setting the duration of the timer to allow for maintenance operations to be completed before entering the low power mode may improve the overall efficiency and performance of the non-volatile memory 210.

Figure 3:
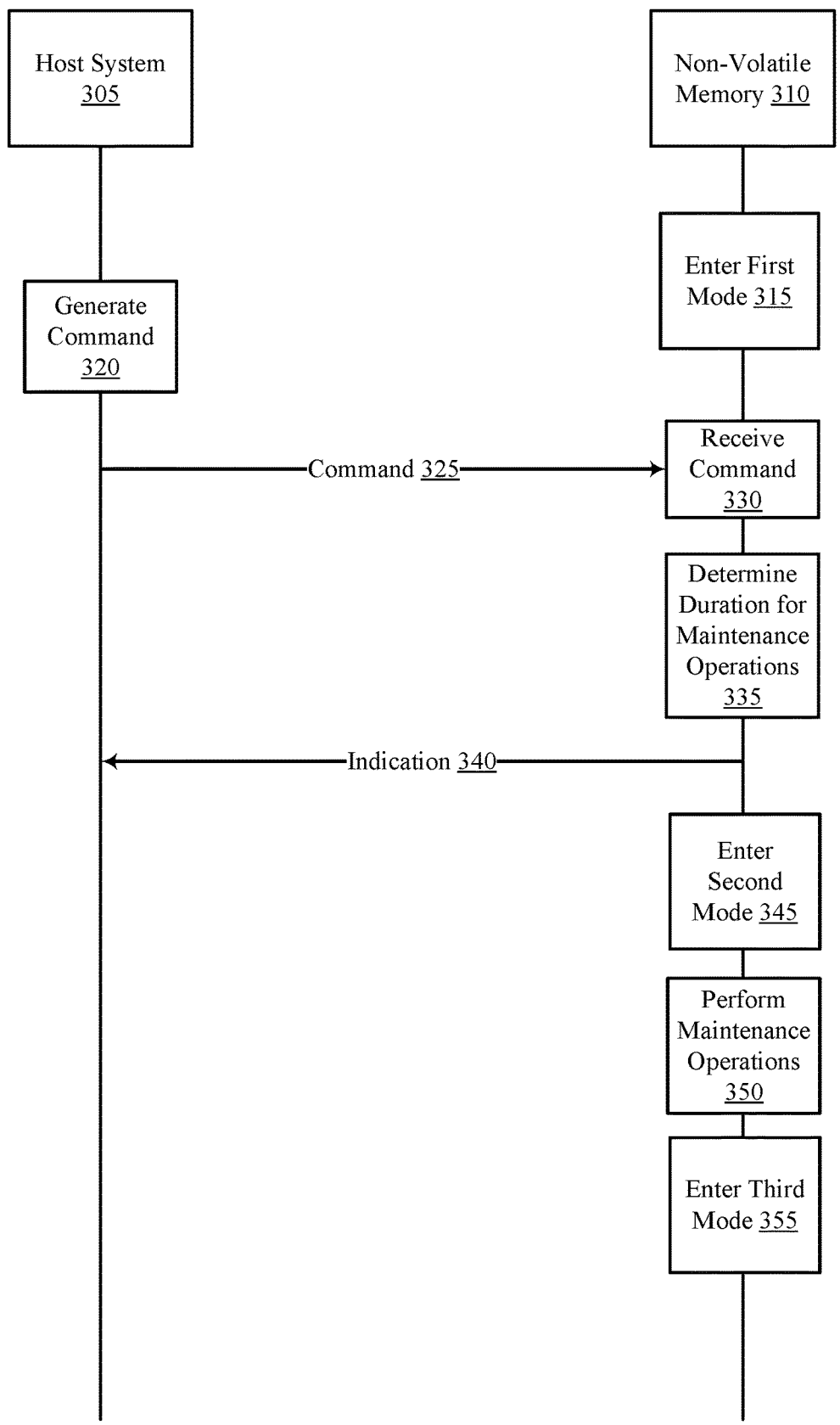

FIG. 3 illustrates an example process flow diagram 300 that supports a dynamic interval for entering a low power state in accordance with examples as disclosed herein. The process flow diagram 300 may illustrate operations performed at or by a host system 305, which may be an example of a host system 105 or 205 as described with reference to FIG. 1 or FIG. 2, and a non-volatile memory 310, which may be an example of a memory system 110, memory device 130, or non-volatile memory 210 as described with reference to FIG. 1. or FIG. 2.

As illustrated in FIG. 3, the non-volatile memory 310 may be configured to indicate (e.g., to the host system 305) a duration needed to perform one or more maintenance operations. At some time after receiving this indication from the non-volatile memory 310, the host system 305 may transmit a command (e.g., a hibernate command) to enter the non-volatile memory 310 into a low power state (e.g., into a hibernate state, a hibernate mode). The non-volatile memory 310 may perform the maintenance operations (or a subset of the maintenance operations) and subsequently enter the low power state. Accordingly, the maintenance operations being performed on the non-volatile memory 310 may be completed before entering into a low power state, which may improve the overall efficiency of the non-volatile memory 310.

At 315, the non-volatile memory 310 may enter into a first mode (e.g., a first operating mode). In some examples, the first mode may be an idle mode. During the idle mode, the non-volatile memory 310 may not be actively receiving or executing commands from the host system 305. For example, the non-volatile memory 310 may not be receiving any access commands or performing any access operations. Alternatively, the first mode may be an active mode in which the non-volatile memory 310 may receive access commands and execute access operations.

At 320, the host system 305 may generate a command (e.g., a hibernate command) for entering the non-volatile memory 310 into a low power mode, and at 325, the host system 305 may issue (e.g., transmit) the command to the non-volatile memory 310. In some instances, the command may be generated and transmitted based on the expiration of a timer The timer may be initiated upon the transmission of a command (e.g., an access command) to the non-volatile memory 310 and the hibernate command may be transmitted once the timer expires (e.g., based on an absence of commands transmitted or to be transmitted from the host system 305 to the non-volatile memory 310).

At 330, the non-volatile memory 310 may receive the command. In some instances, the non-volatile memory 310 (or a local controller internal to the non-volatile memory 310 or a memory system controller associated with the non-volatile memory 310) may delay hibernating in response to the command due to one or more pending maintenance operations (e.g., based on the quantity of pending maintenance operations exceeding a threshold, which may zero, or one or more pending maintenance operations being of sufficient urgency, or any combination thereof). As described herein, maintenance operations may include wear-leveling operations, garbage collection operations, error-correcting operations, encryption operations, caching operations, media management operations, background refresh operations, health monitoring operations, or address translations between logical addresses associated with commands from the host device and physical addresses of the non-volatile memory.

At 335, the non-volatile memory 310 (e.g., a local memory controller or an associated memory system controller) may determine a duration for performing one or more pending maintenance operations on the non-volatile memory 310. For example, the non-volatile memory 310 may store an indication of maintenance operations to be performed on the non-volatile memory at a status register or other component. In some examples, the non-volatile memory 310 may determine a duration for performing all of the identified maintenance operations, while in other examples the non-volatile memory 310 may determine a duration for performing a subset of the identified maintenance operations that exceed an urgency threshold. At 340, the non-volatile memory 310 may transmit an indication of the duration determined at 335 to the host system 305. Though the determination at 335 and the indication at 340 are shown in the example of FIG. 3 as occurring after the command is received at 330, it is to be understood that the determination at 335 and the indication at 340 may alternatively be sent before the command is received at 330 (e.g., based on the non-volatile memory 310 entering the first mode at 315).

At 345, the non-volatile memory 310 may transition to operating in a second mode (e.g., a second power mode). In some examples, the second mode may consume less power than the first mode (e.g., less than an idle mode or an active mode but more than the low power mode). The second mode may in some cases be reserved for (e.g., dedicated to) performing maintenance operations. For example, when operating in the second mode, operations performed by the non-volatile memory 310 may be restricted (e.g., limited) to maintenance operations. In some examples, the non-volatile memory 310 may enter the second mode based on receiving the hibernate command (e.g., at 340).

At 350, the non-volatile memory 310 (e.g., a local memory controller internal to the non-volatile memory 310 or a memory system controller associated with the non-volatile memory 310) may perform maintenance operations on the non-volatile memory 310 while operating in the second mode. The maintenance operations may be performed within the duration indicated to the host system 305 at 340 such that the maintenance operations performed on the non-volatile memory 310 may be completed before entering a low power mode.

At 355, the non-volatile memory 310 may transition to operating in a third mode (e.g., a third power mode). In some examples, the third mode may correspond to a low power mode, which may consume less power than the first mode and the second mode. When operating in the third mode, the non-volatile memory 310 may refrain from performing any maintenance operations.

Thus, the non-volatile memory 310 may delay entering into the third mode (e.g., a hibernate mode) after receiving a corresponding command (e.g., a hibernate command), which may allow for the non-volatile memory 310 to perform one or more maintenance operations before entering into the third mode. Further, the non-volatile memory 310 may indicate a duration of the delay to the host system 305. Allowing for pending maintenance operations (or a subset thereof) to be completed before entering the low power mode may delay the latency with which maintenance operations are performed or provide other benefits as described herein or may be appreciated by one of ordinary skill in the art.

Figure 4:
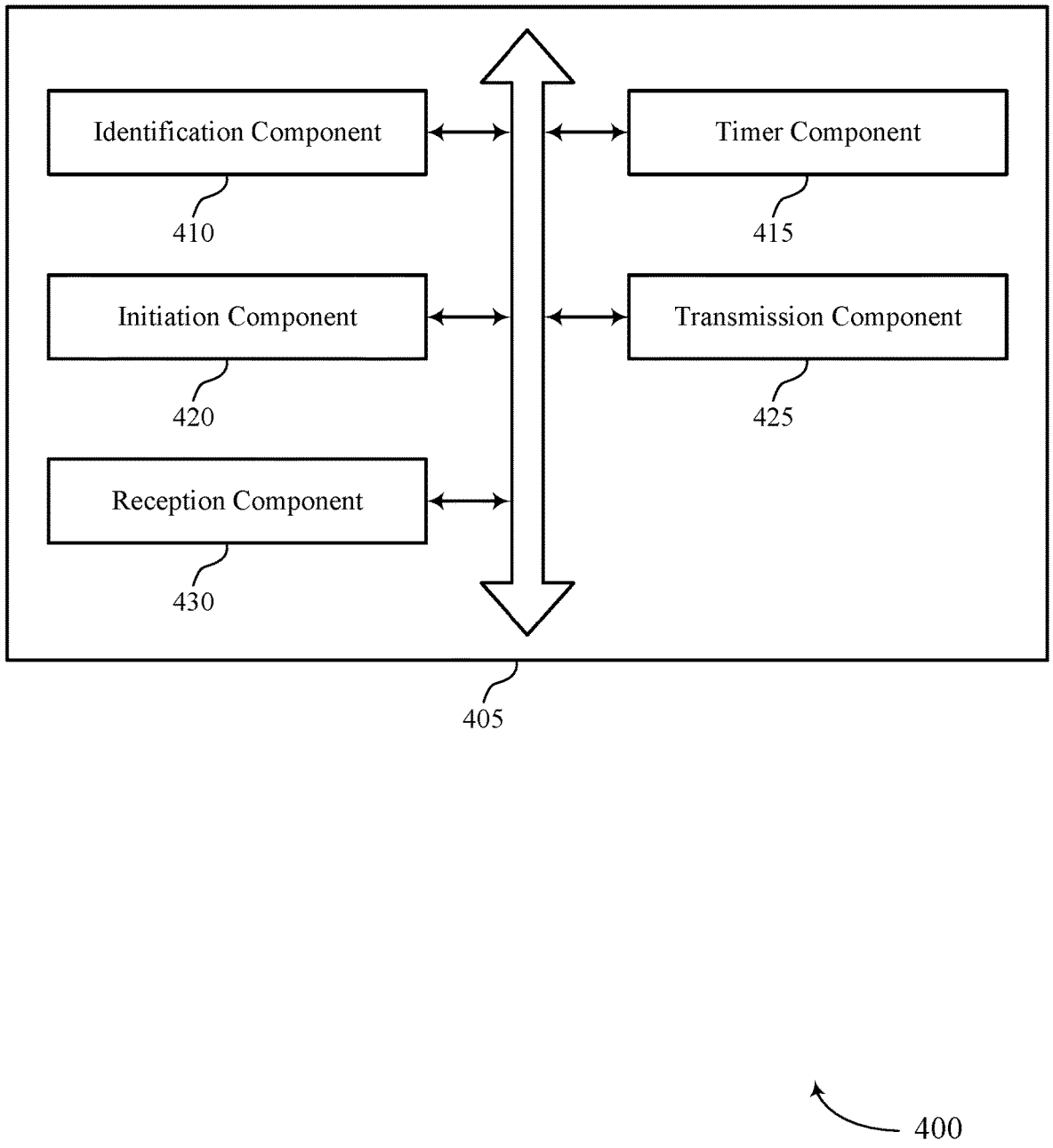
FIG. 4 shows a block diagram of a host device that supports a dynamic interval for entering a low power state in accordance with aspects of the present disclosure.

FIG. 4 shows a block diagram 400 of a host device 405 that supports a dynamic interval for entering a low power state in accordance with examples as disclosed herein. The host device 405 may be an example of aspects of a host device as described with reference to FIGS. 1 through 3. The host device 405 may include an identification component 410, a timer component 415, a timer component 420, a transmission component 425, and a reception component 430. Each of these modules may communicate, directly or indirectly, with one another (e.g., via one or more buses).

The identification component 410 may identify a state of maintenance operations of a non-volatile memory. In some examples, the identification component 410 may identify a second state of maintenance operations of the non-volatile memory after transmitting the second command.

In some examples, the identification component 410 may identify the state of maintenance operations of the non-volatile memory based on the reception component 430 receiving, from the non-volatile memory, an indication of the state of maintenance operations of the non-volatile memory. In some examples, the identification component 410 may identify the state of maintenance operations of the non-volatile memory based on the transmission component 425 transmitting, to the non-volatile memory, a request for the indication of the state of maintenance operations of the non-volatile memory, where the indication of the state of maintenance operations of the non-volatile memory is received based on transmitting the request.

The timer component 415 may set a duration of a timer based on the state of maintenance operations of the non-volatile memory. In some examples, the timer component 415 may set the duration of the timer to a second value based on the second state of maintenance operations of the non-volatile memory.

The timer component 415 may initiate the timer based on the transmission component 425 transmitting a first command to the non-volatile memory. In some examples, the timer component 415 may initiate the timer with the duration set to the second value based on the transmission component 425 transmitting a fourth command to the non-volatile memory. In some examples, the timer component 420 may reinitiate the timer based on a third command being transmitted to the non-volatile memory before the expiration of the timer, the third command being transmitted after the first command and before the second command.

The transmission component 425 may transmit, to the non-volatile memory, a second command for the non-volatile memory to enter into a low power state based on an expiration of the timer. In some examples, the transmission component 425 may transmit, to the non-volatile memory, a fifth command for entering the non-volatile memory into the low power state based on an expiration of the timer.

In some cases, the second command is transmitted based on an absence of signaling being transmitted to the non-volatile memory after the third command and before the expiration of the timer. In some cases, the second command includes a hibernate command. In some cases, the state of maintenance operations of the non-volatile memory includes a quantity of pending maintenance operations, an urgency of one or more pending maintenance operations, or a combination thereof.

Figure 5:
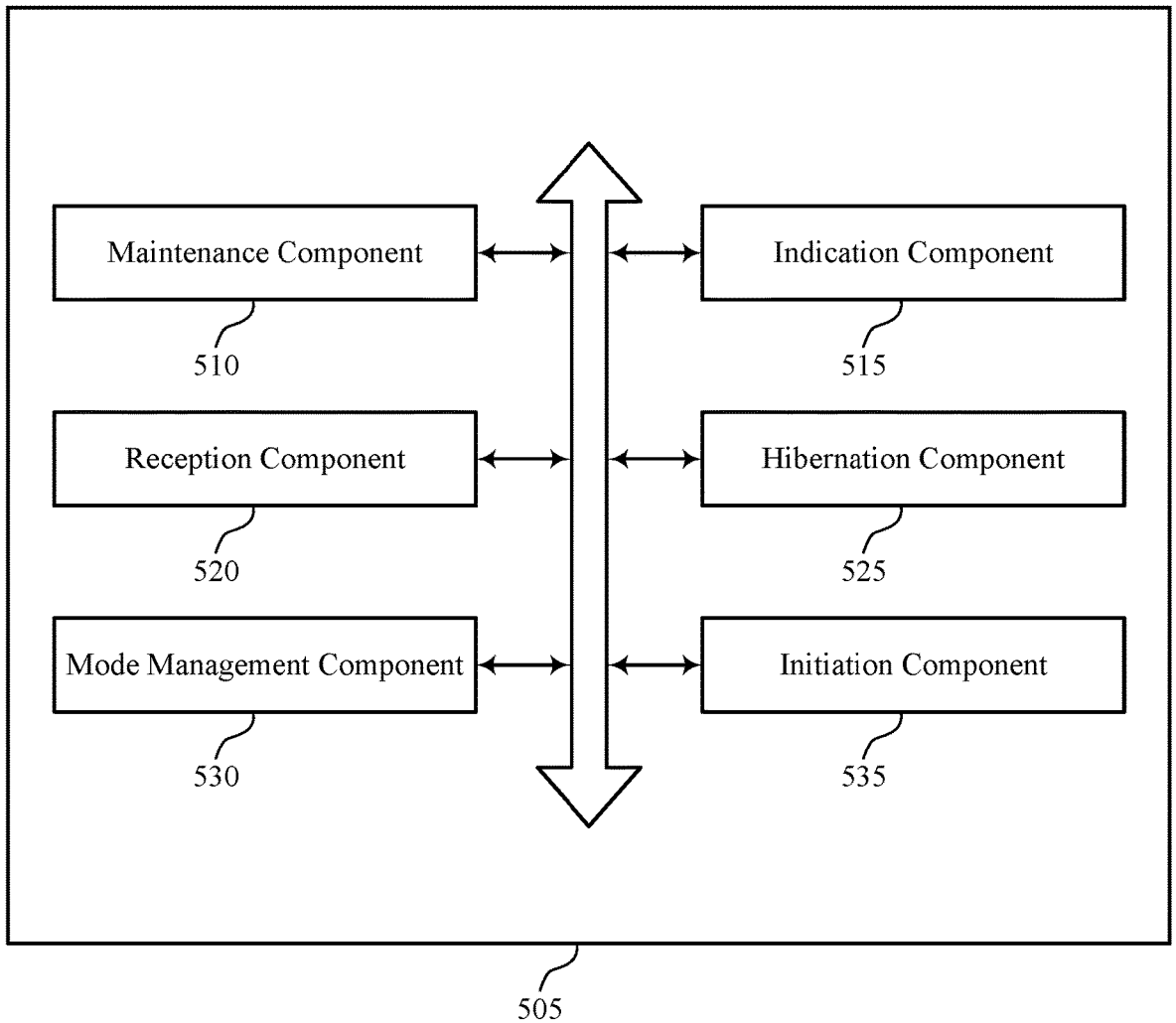
FIG. 5 shows a block diagram of a memory device that supports a dynamic interval for entering a low power state in accordance with aspects of the present disclosure.

FIG. 5 shows a block diagram 500 of a memory device 505 that supports a dynamic interval for entering a low power state in accordance with examples as disclosed herein. The memory device 505, which may be or may include a non-volatile memory (e.g., an array of non-volatile memory cells), may be an example of aspects of a memory device as described with reference to FIGS. 1 through 3. The memory device 505 may include a maintenance component 510, an indication component 515, a reception component 520, a hibernation component 525, a mode management component 530, and an initiation component 535. Each of these modules may communicate, directly or indirectly, with one another (e.g., via one or more buses).

The maintenance component 510 may perform maintenance operations on a non-volatile memory. In some examples, the maintenance component 510 may perform one or more maintenance operations while the non-volatile memory is operating in a second mode.

In some examples, the maintenance component 510 may perform second maintenance operations on the non-volatile memory after the non-volatile memory is exited from a low power state.

The indication component 515 may transmit, to a host device for the non-volatile memory, an indication of a state of the maintenance operations of the non-volatile memory. In some examples, the indication component 515 may transmit, to the host device, a second indication of a second state of maintenance operations of the non-volatile memory while the second maintenance operations are being performed on the non-volatile memory. In some examples, the indication component 515 may transmit, to a host device for the non-volatile memory, an indication of a duration for performing the one or more maintenance operations.

The reception component 520 may receive a first command from the host device. In some examples, the reception component 520 may receive, after a duration from receiving the first command, a second command for the non-volatile memory to enter into a low power state, where the duration is based on the state of the maintenance operations of the non-volatile memory. In some examples, the reception component 520 may receive a command for a non-volatile memory to enter into a low power state.

In some examples, the reception component 520 may receive a third command from the host device. In some examples, the reception component 520 may receive, after a second duration from receiving the third command, a fourth command for entering into the low power state, where the second duration is based on the second state of maintenance operations of the non-volatile memory and is different than the duration between the first command and the second command. In some examples, the reception component 520 may receive, from the host device, a request for the indication of the state of the maintenance operations of the non-volatile memory, where transmitting the indication of the state of the maintenance operations of the non-volatile memory based on receiving the request.

The hibernation component 525 may cause the non-volatile memory to enter into the low power state based on receiving the second command. In some examples, the hibernation component 525 may cause the non-volatile memory to enter into the low power state based on receiving the fourth command.

The maintenance component 510 may determine the state of the maintenance operations of the non-volatile memory based on a quantity of pending maintenance operations for the non-volatile memory, an urgency of one or more maintenance operations for the non-volatile memory, or any combination thereof. In some examples, the maintenance component 510 may determine the duration for performing the one or more maintenance operations based on a quantity of pending maintenance operations, an urgency of one or more pending maintenance operations, or a combination thereof.

The mode management component 530 may cause the non-volatile memory to exit from the low power state.

The initiation component 535 may initiate performing the maintenance operations on the non-volatile memory is based on not receiving any further command for at least a second duration after receiving the first command, the second duration is less than the duration.

The mode management component 530 may change an operational mode of the non-volatile memory from a first mode to a second mode based on receiving the command for entering the non-volatile memory into the low power state.

In some cases, the second command includes a hibernate command. In some cases, the maintenance operations include one or more of wear-leveling operations, garbage collection operations, error-correcting operations, encryption operations, caching operations, media management operations, background refresh operations, health monitoring operations, or address translations between logical addresses associated with commands from the host device and physical addresses of the non-volatile memory. In some cases, the first mode includes a first power state and the second mode includes a second power state between the first power state and the low power state.

In some cases, the command includes a hibernate command and the one or more maintenance operations include one or more of wear-leveling operations, garbage collection operations, error-correcting operations, encryption operations, caching operations, media management operations, background refresh operations, health monitoring operations, or address translations between logical addresses associated with commands from the host device and physical addresses of the non-volatile memory.

In some examples, changing the operational mode of the non-volatile memory from the second mode to a third mode after performing the one or more maintenance operations, where the third mode includes the low power state.

Figure 6:
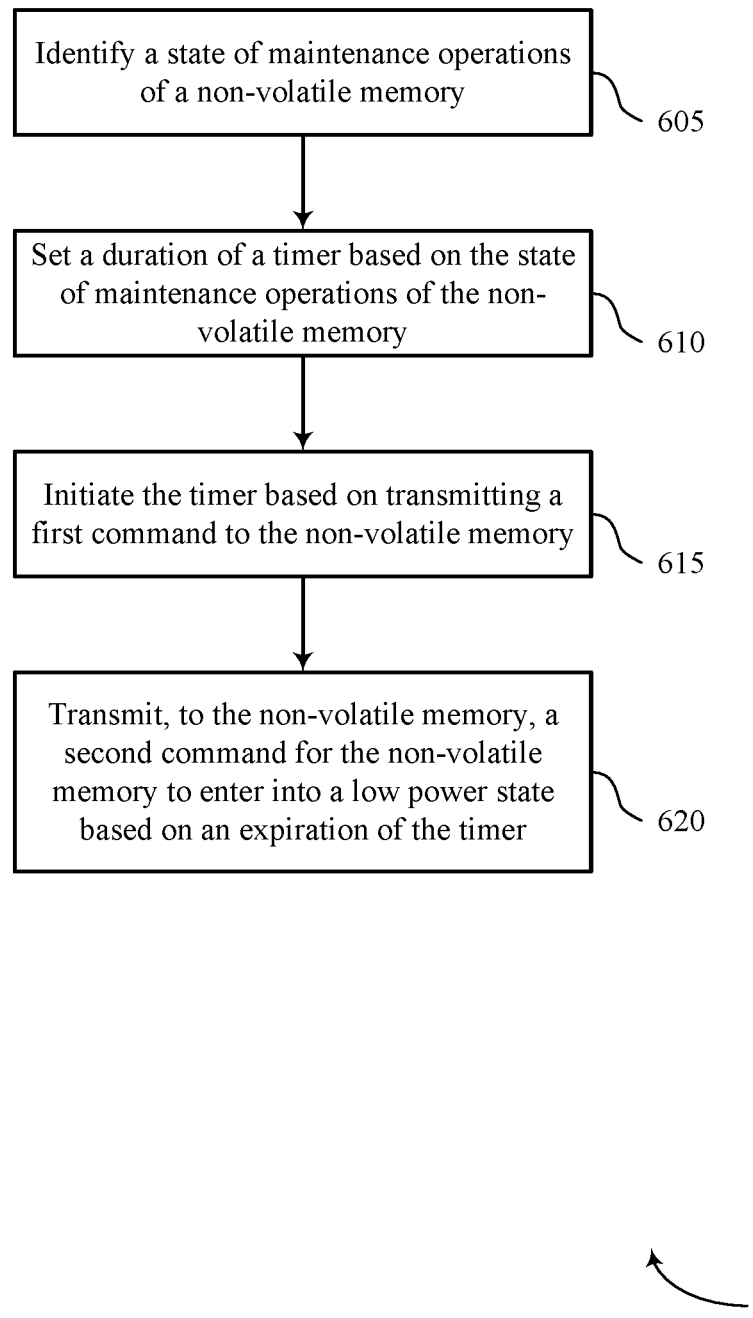
FIGS. 6 through 8 show flowcharts illustrating a method or methods that support a dynamic interval for entering a low power state in accordance with examples as disclosed herein.

FIG. 6 shows a flowchart illustrating a method or methods 600 that supports a dynamic interval for entering a low power state in accordance with aspects of the present disclosure. The operations of method 600 may be implemented by a host device or its components as described herein. For example, the operations of method 600 may be performed by a host device as described with reference to FIG. 4. In some examples, a host device may execute a set of instructions to control the functional elements of the host device to perform the described functions. Additionally or alternatively, a host device may perform aspects of the described functions using special-purpose hardware, such as a processor.

At 605, a state of maintenance operations of a non-volatile memory may be identified by a host device. The operations of 605 may be performed according to the methods described herein. In some examples, aspects of the operations of 605 may be performed by an identification component as described with reference to FIG. 4.

At 610, a duration of a timer may be set, by the host device, based on the state of maintenance operations of the non-volatile memory. The operations of 610 may be performed according to the methods described herein. In some examples, aspects of the operations of 610 may be performed by a timer component as described with reference to FIG. 4.

At 615, the timer may be initiated, by the host device, based on transmitting a first command to the non-volatile memory. The operations of 615 may be performed according to the methods described herein. In some examples, aspects of the operations of 615 may be performed by the timer component as described with reference to FIG. 4.

At 620, a second command may be transmitted, by the host device, for the non-volatile memory to enter into a low power state based on an expiration of the timer. The operations of 620 may be performed according to the methods described herein. In some examples, aspects of the operations of 620 may be performed by a command component as described with reference to FIG. 4.

In some examples, an apparatus as described herein may perform a method or methods, such as the method 600. The apparatus may include features, means, or instructions (e.g., a non-transitory computer-readable medium storing instructions executable by a processor) for identifying a state of maintenance operations of a non-volatile memory, setting a duration of a timer based on the state of maintenance operations of the non-volatile memory, initiating the timer based on transmitting a first command to the non-volatile memory, and transmitting, to the non-volatile memory, a second command for the non-volatile memory to enter into a low power state based on an expiration of the timer.

Some examples of the method 600 and the apparatus described herein may further include operations, features, means, or instructions for identifying a second state of maintenance operations of the non-volatile memory after transmitting the second command, setting the duration of the timer to a second value based on the second state of maintenance operations of the non-volatile memory, initiating the timer with the duration set to the second value based on transmitting a fourth command to the non-volatile memory, and transmitting, to the non-volatile memory, a fifth command for entering the non-volatile memory into the low power state based on an expiration of the timer.

In some examples of the method 600 and the apparatus described herein, the operations, features, means, or instructions for identifying the state of maintenance operations of the non-volatile memory may include operations, features, means, or instructions for receiving, from the non-volatile memory, an indication of the state of maintenance operations of the non-volatile memory.

In some examples of the method 600 and the apparatus described herein, the operations, features, means, or instructions for identifying the state of maintenance operations of the non-volatile memory may include operations, features, means, or instructions for transmitting, to the non-volatile memory, a request for the indication of the state of maintenance operations of the non-volatile memory, and the indication of the state of maintenance operations of the non-volatile memory may be received based on transmitting the request.

Some examples of the method 600 and the apparatus described herein may further include operations, features, means, or instructions for reinitiating the timer based on a third command being transmitted to the non-volatile memory before the expiration of the timer, the third command being transmitted after the first command and before the second command.

In some examples of the method 600 and the apparatus described herein, the second command may be transmitted based on an absence of signaling being transmitted to the non-volatile memory after the third command and before the expiration of the timer.

In some examples of the method 600 and the apparatus described herein, the second command may include a hibernate command.

In some examples of the method 600 and the apparatus described herein, the state of maintenance operations of the non-volatile memory may include a quantity of pending maintenance operations, an urgency of one or more pending maintenance operations, or a combination thereof.

Figure 7:
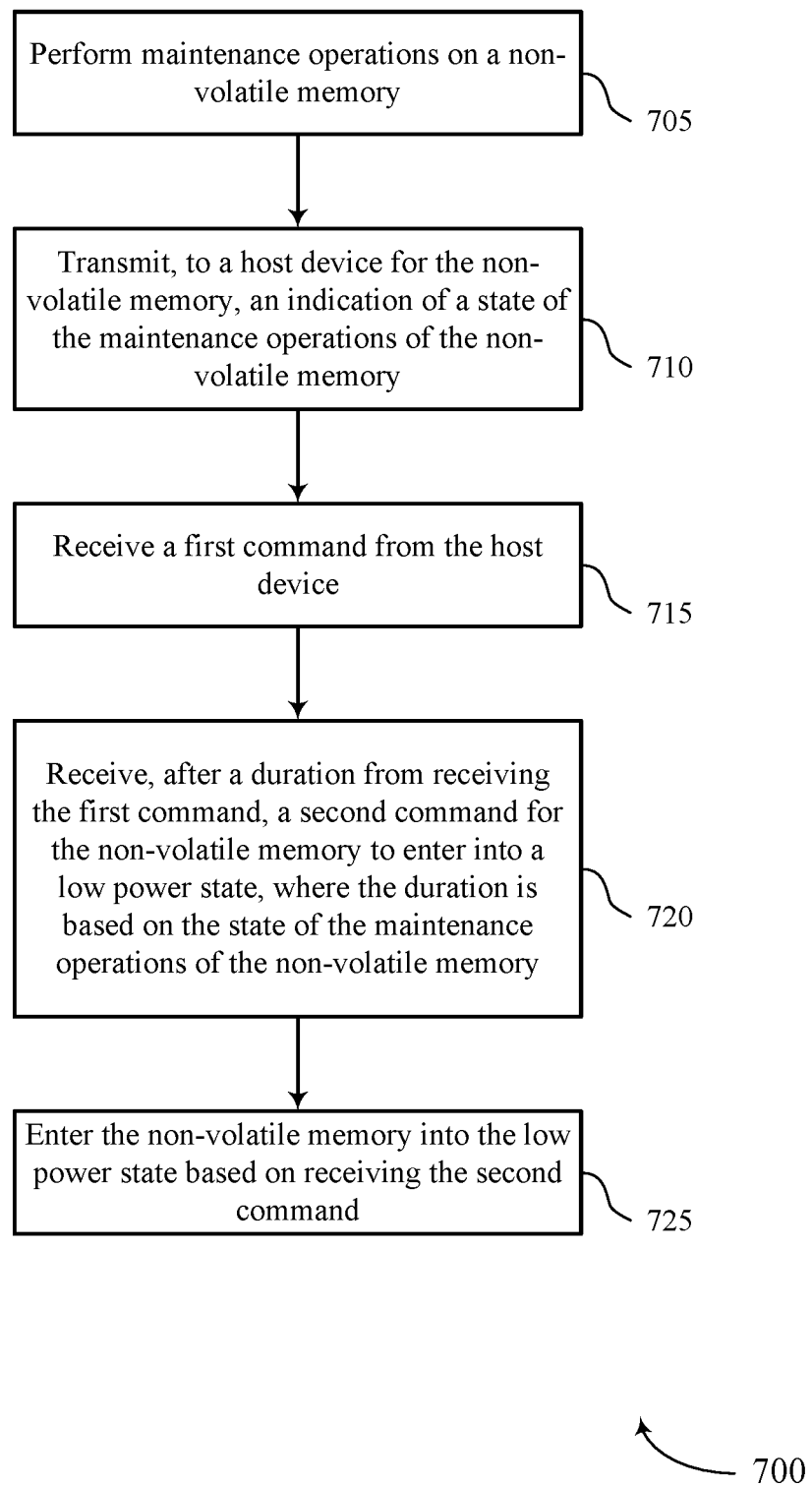

FIG. 7 shows a flowchart illustrating a method or methods 700 that supports a dynamic interval for entering a low power state in accordance with aspects of the present disclosure. The operations of method 700 may be implemented by a memory device or its components as described herein. For example, the operations of method 700 may be performed by a memory device as described with reference to FIG. 5. In some examples, a memory device may execute a set of instructions to control the functional elements of the memory device to perform the described functions. Additionally or alternatively, a memory device may perform aspects of the described functions using special-purpose hardware.

At 705, maintenance operations may be performed on a non-volatile memory. The operations of 705 may be performed according to the methods described herein. In some examples, aspects of the operations of 705 may be performed by a maintenance component as described with reference to FIG. 5.

At 710, an indication of a state of the maintenance operations of the non-volatile memory may be transmitted to a host device for the non-volatile memory. The operations of 710 may be performed according to the methods described herein. In some examples, aspects of the operations of 710 may be performed by an indication component as described with reference to FIG. 5.

At 715, a first command may be received from the host device. The operations of 715 may be performed according to the methods described herein. In some examples, aspects of the operations of 715 may be performed by a reception component as described with reference to FIG. 5.

At 720, a second command for the non-volatile memory to enter into a low power state may be received, after a duration from receiving the first command, where the duration is based on the state of the maintenance operations of the non-volatile memory. The operations of 720 may be performed according to the methods described herein. In some examples, aspects of the operations of 720 may be performed by a reception component as described with reference to FIG. 5.

At 725, the low power state may be entered based on receiving the second command. The operations of 725 may be performed according to the methods described herein. In some examples, aspects of the operations of 725 may be performed by a hibernation component as described with reference to FIG. 5.

In some examples, an apparatus as described herein may perform a method or methods, such as the method 700. The apparatus may include features, means, or instructions (e.g., a non-transitory computer-readable medium storing instructions executable by a processor) for performing maintenance operations on a non-volatile memory, transmitting, to a host device for the non-volatile memory, an indication of a state of the maintenance operations of the non-volatile memory, receiving a first command from the host device, receiving, after a duration from receiving the first command, a second command for the non-volatile memory to enter into a low power state, and the duration may be based on the state of the maintenance operations of the non-volatile memory, and entering the non-volatile memory into the low power state based on receiving the second command.

Some examples of the method 700 and the apparatus described herein may further include operations, features, means, or instructions for determining the state of the maintenance operations of the non-volatile memory based on a quantity of pending maintenance operations for the non-volatile memory, an urgency of one or more maintenance operations for the non-volatile memory, or any combination thereof.

Some examples of the method 700 and the apparatus described herein may further include operations, features, means, or instructions for exiting the non-volatile memory from the low power state, performing second maintenance operations on the non-volatile memory after the non-volatile memory may be exited from the low power state, transmitting, to the host device, a second indication of a second state of maintenance operations of the non-volatile memory while the second maintenance operations may be being performed on the non-volatile memory, receiving a third command from the host device, receiving, after a second duration from receiving the third command, a fourth command for entering into the low power state, and the second duration may be based on the second state of maintenance operations of the non-volatile memory and may be different than the duration between the first command and the second command, and entering the non-volatile memory into the low power state based on receiving the fourth command.

Some examples of the method 700 and the apparatus described herein may further include operations, features, means, or instructions for receiving, from the host device, a request for the indication of the state of the maintenance operations of the non-volatile memory, where transmitting the indication of the state of the maintenance operations of the non-volatile memory based on receiving the request.

In some examples of the method 700 and the apparatus described herein, the second command may include a hibernate command.

Some examples of the method 700 and the apparatus described herein may further include operations, features, means, or instructions for initiating performing the maintenance operations on the non-volatile memory may be based on not receiving any further command for at least a second duration after receiving the first command, and the second duration may be less than the duration.

In some examples of the method 700 and the apparatus described herein, the maintenance operations include one or more of wear-leveling operations, garbage collection operations, error-correcting operations, encryption operations, caching operations, media management operations, background refresh operations, health monitoring operations, or address translations between logical addresses associated with commands from the host device and physical addresses of the non-volatile memory.

Figure 8:
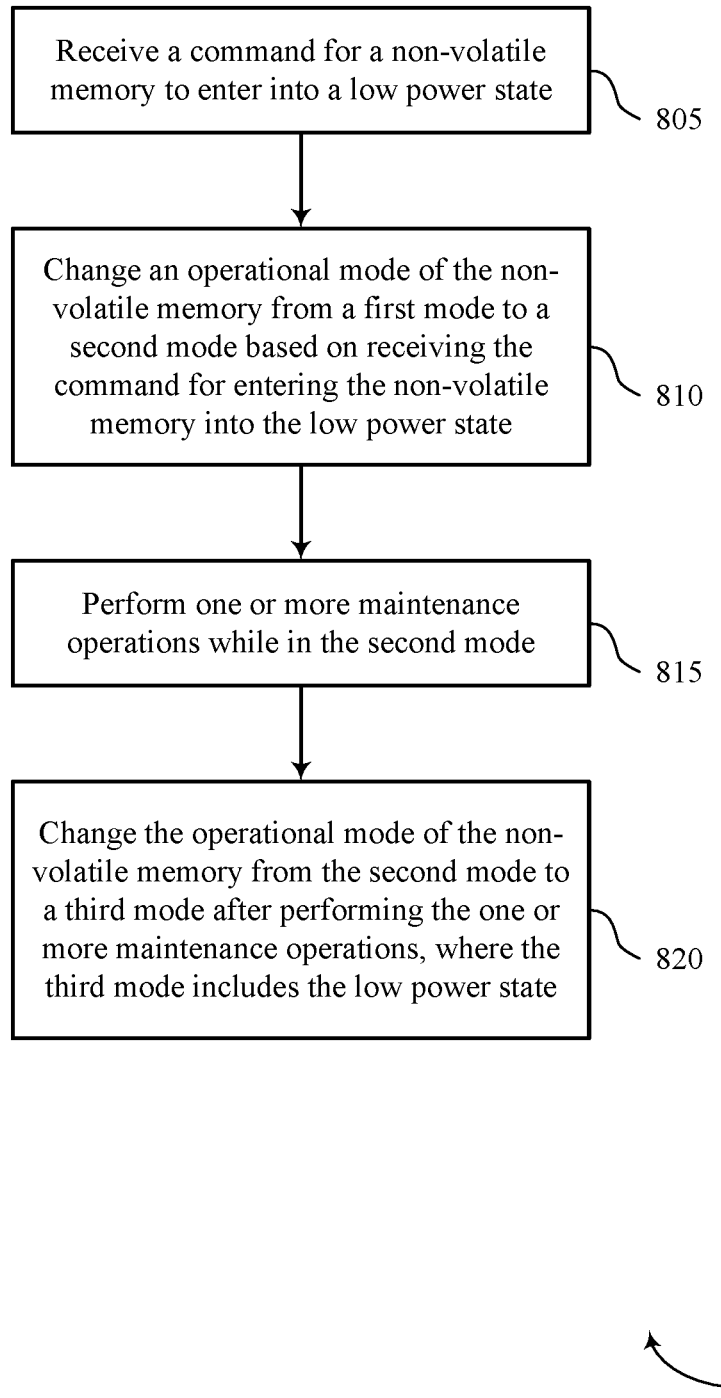

FIG. 8 shows a flowchart illustrating a method or methods 800 that supports a dynamic interval for entering a low power state in accordance with aspects of the present disclosure. The operations of method 800 may be implemented by a memory device or its components as described herein. For example, the operations of method 800 may be performed by a memory device as described with reference to FIG. 5. In some examples, a memory device may execute a set of instructions to control the functional elements of the memory device to perform the described functions. Additionally or alternatively, a memory device may perform aspects of the described functions using special-purpose hardware.

At 805, a command for a non-volatile memory to enter into a low power state may be received. The operations of 805 may be performed according to the methods described herein. In some examples, aspects of the operations of 805 may be performed by a reception component as described with reference to FIG. 5.

At 810, an operational mode of the non-volatile memory may be changed from a first mode to a second mode based on receiving the command for entering the non-volatile memory into the low power state. The operations of 810 may be performed according to the methods described herein. In some examples, aspects of the operations of 810 may be performed by a mode management component as described with reference to FIG. 5.

At 815, one or more maintenance operations may be performed while the non-volatile memory is in the second mode. The operations of 815 may be performed according to the methods described herein. In some examples, aspects of the operations of 815 may be performed by a maintenance component as described with reference to FIG. 5.

At 820, the operational mode of the non-volatile memory may be changed from the second mode to a third mode after performing the one or more maintenance operations, where the third mode includes the low power state. The operations of 820 may be performed according to the methods described herein. In some examples, aspects of the operations of 820 may be performed by a mode management component as described with reference to FIG. 5.

In some examples, an apparatus as described herein may perform a method or methods, such as the method 800. The apparatus may include features, means, or instructions (e.g., a non-transitory computer-readable medium storing instructions executable by a processor) for receiving a command for a non-volatile memory to enter into a low power state, changing an operational mode of the non-volatile memory from a first mode to a second mode based on receiving the command for entering the non-volatile memory into the low power state, performing one or more maintenance operations while in the second mode, and changing the operational mode of the non-volatile memory from the second mode to a third mode after performing the one or more maintenance operations, and the third mode may include the low power state.

Some examples of the method 800 and the apparatus described herein may further include operations, features, means, or instructions for transmitting, to a host device for the non-volatile memory, an indication of a duration for performing the one or more maintenance operations.

Some examples of the method 800 and the apparatus described herein may further include operations, features, means, or instructions for determining the duration for performing the one or more maintenance operations based on a quantity of pending maintenance operations, an urgency of one or more pending maintenance operations, or a combination thereof.

In some examples of the method 800 and the apparatus described herein, the first mode includes a first power state and the second mode includes a second power state between the first power state and the low power state.

In some examples of the method 800 and the apparatus described herein, the command includes a hibernate command and the one or more maintenance operations may include one or more of wear-leveling operations, garbage collection operations, error-correcting operations, encryption operations, caching operations, media management operations, background refresh operations, health monitoring operations, or address translations between logical addresses associated with commands from the host device and physical addresses of the non-volatile memory.

It should be noted that the methods described above describe possible implementations, and that the operations and the steps may be rearranged or otherwise modified and that other implementations are possible. Further, portions from two or more of the methods may be combined.

An apparatus is described. In some examples, the apparatus may include a processor configured to identify a state of maintenance operations of a non-volatile memory, set a duration of a timer based at least in part on the state of maintenance operations of the non-volatile memory, initiate the timer based at least in part on transmitting a first command to the non-volatile memory, and transmit, to the non-volatile memory, a second command for the non-volatile memory to enter into a low power state based at least in part on an expiration of the timer.

In some examples, the processor may be configured to identify a second state of maintenance operations of the non-volatile memory after transmitting the second command, set the duration of the timer to a second value based at least in part on the second state of maintenance operations of the non-volatile memory, initiate the timer with the duration set to the second value based at least in part on transmitting a fourth command to the non-volatile memory, and transmit, to the non-volatile memory, a fifth command for entering the non-volatile memory into the low power state based at least in part on an expiration of the timer.

In some examples, the processor may be configured to identify the state of maintenance operations of the non-volatile memory based on receiving, from the non-volatile memory, an indication of the state of maintenance operations of the non-volatile memory.

In some examples, the processor may be configured to identify the state of maintenance operations of the non-volatile memory based on transmitting, to the non-volatile memory, a request for the indication of the state of maintenance operations of the non-volatile memory, where the indication of the state of maintenance operations of the non-volatile memory is received based at least in part on transmitting the request.

In some examples, the processor may be configured to reinitiate the timer based at least in part on a third command being transmitted to the non-volatile memory before the expiration of the timer, the third command being transmitted after the first command and before the second command.

In some examples, the second command may be transmitted based at least in part on an absence of signaling being transmitted to the non-volatile memory after the third command and before the expiration of the timer.

In some examples, the second command may include a hibernate command.

In some examples, the state of maintenance operations of the non-volatile memory may include a quantity of pending maintenance operations, an urgency of one or more pending maintenance operations, or a combination thereof.

An apparatus is described. In some examples, the apparatus may include a non-volatile memory that includes a controller configured to perform maintenance operations on the non-volatile memory, transmit, to a host device for the non-volatile memory, an indication of a state of the maintenance operations of the non-volatile memory, receive a first command from the host device, receive, after a duration from receiving the first command, a second command for the non-volatile memory to enter into a low power state, where the duration is based at least in part on the state of the maintenance operations of the non-volatile memory, and enter the non-volatile memory into the low power state based at least in part on receiving the second command.

In some examples, the controller may be configured to determine the state of the maintenance operations of the non-volatile memory based at least in part on a quantity of pending maintenance operations for the non-volatile memory, an urgency of one or more maintenance operations for the non-volatile memory, or any combination thereof.

In some examples, the controller may be configured to exit the non-volatile memory from the low power state, perform second maintenance operations on the non-volatile memory after the non-volatile memory is exited from the low power state, transmit, to the host device, a second indication of a second state of maintenance operations of the non-volatile memory while the second maintenance operations are being performed on the non-volatile memory, receive a third command from the host device, receive, after a second duration from receiving the third command, a fourth command for entering into the low power state, where the second duration is based at least in part on the second state of maintenance operations of the non-volatile memory and is different than the duration between the first command and the second command, and enter the non-volatile memory into the low power state based at least in part on receiving the fourth command.

In some examples, the controller may be configured to receive, from the host device, a request for the indication of the state of the maintenance operations of the non-volatile memory, where the controller is configured to transmit the indication of the state of the maintenance operations of the non-volatile memory based at least in part on receiving the request.

In some examples, the second command may include a hibernate command.

In some examples, the controller may be configured to initiate performing the maintenance operations on the non-volatile memory based at least in part on not receiving any further command for at least a second duration after receiving the first command, the second duration is less than the duration.

In some examples, the maintenance operations may include one or more of wear-leveling operations, garbage collection operations, error-correcting operations, encryption operations, caching operations, media management operations, background refresh operations, health monitoring operations, or address translations between logical addresses associated with commands from the host device and physical addresses of the non-volatile memory.

An apparatus is described. In some examples, the apparatus may include a non-volatile memory that includes a controller configured to receive a command for the non-volatile memory to enter into a low power state, change an operational mode of the non-volatile memory from a first mode to a second mode based at least in part on receiving the command for entering the non-volatile memory into the low power state, perform one or more maintenance operations while in the second mode, and change the operational mode of the non-volatile memory from the second mode to a third mode after performing the one or more maintenance operations, where the third mode may include the low power state.

In some examples, the controller may be configured to transmit, to a host device for the non-volatile memory, an indication of a duration for performing the one or more maintenance operations.

In some examples, the controller may be configured to determine the duration for performing the one or more maintenance operations based at least in part on a quantity of pending maintenance operations, an urgency of one or more pending maintenance operations, or a combination thereof.

In some examples, the first mode may include a first power state and the second mode may include a second power state between the first power state and the low power state.

In some examples, the command may include a hibernate command and the one or more maintenance operations may include one or more of wear-leveling operations, garbage collection operations, error-correcting operations, encryption operations, caching operations, media management operations, background refresh operations, health monitoring operations, or address translations between logical addresses associated with commands from the host device and physical addresses of the non-volatile memory.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
   one or more controllers configured to:
   transmit, to a non-volatile memory, a request for an indication of a state of maintenance operations of the non-volatile memory, the state of maintenance operations comprising a quantity of pending maintenance operations;
   identify a first state of maintenance operations of the non-volatile memory based at least in part on transmitting the request, the first state of maintenance operations comprising a first quantity of pending maintenance operations corresponding to a first duration for performing one or more maintenance operations;
   set a duration of a timer to the first duration based at least in part on the first quantity of pending maintenance operations, wherein the first duration is greater than a second duration corresponding to a second quantity of pending maintenance operations;
   initiate the timer based at least in part on transmitting a first command to the non-volatile memory; and
   transmit, to the non-volatile memory, a second command for the non-volatile memory to enter into a low power state based at least in part on an expiration of the timer, the expiration of the timer based at least in part on an absence of commands transmitted during the first duration.

2. The apparatus of claim 1, wherein the one or more controllers are configured to:
   identify a second state of maintenance operations of the non-volatile memory after transmitting the second command;
   set the duration of the timer to a second value based at least in part on the second state of maintenance operations of the non-volatile memory;
   initiate the timer with the duration set to the second value based at least in part on transmitting a fourth command to the non-volatile memory; and
   transmit, to the non-volatile memory, a fifth command for entering the non-volatile memory into the low power state based at least in part on an expiration of the timer.

3. The apparatus of claim 1, wherein, to identify the first state of maintenance operations of the non-volatile memory, the one or more controllers are configured to:
   receive, from the non-volatile memory, an indication of the first state of maintenance operations of the non-volatile memory.

4. The apparatus of claim 1, wherein the one or more controllers are configured to:
   reinitiate the timer based at least in part on a third command being transmitted to the non-volatile memory before the expiration of the timer, the third command also being transmitted after the first command and before the second command.

5. The apparatus of claim 4, wherein the one or more controllers are configured to transmit the second command based at least in part on failing to transmit signaling to the non-volatile memory after the third command and before the expiration of the timer.

6. The apparatus of claim 1, wherein the second command comprises a hibernate command.

7. The apparatus of claim 1, wherein, to identify the first state of maintenance operations, the one or more controllers are configured to:
   identify the first state of maintenance operations for the non-volatile memory based at least in part on the first quantity of pending maintenance operations, wherein the first state of maintenance operations corresponds to the first duration for performing the one or more maintenance operations, and a second state of maintenance operations corresponds to the second quantity of pending maintenance operations less than the first quantity of pending maintenance operations and the second duration for performing the one or more maintenance operations that is less than the first duration.

8. An apparatus, comprising:
   a non-volatile memory comprising one or more controllers, the one or more controllers configured to:
   perform maintenance operations on the non-volatile memory;
   store an indication of a state of maintenance operations of the non-volatile memory;
   receive, from a host device for the non-volatile memory, a request for the indication of the state of maintenance operations of the non-volatile memory;
   transmit, to the host device, the indication of the state of the maintenance operations of the non-volatile memory based at least in part on receiving the request, the state of the maintenance operations comprising a quantity of pending maintenance operations;
   receive a first command from the host device;
   receive, after a first duration from receiving the first command, a second command for the non-volatile memory to enter into a low power state based at least in part on an absence of commands received during the first duration, wherein the first duration is based at least in part on the quantity of pending maintenance operations, and wherein the first duration is greater than a second duration corresponding to a second quantity of pending maintenance operations; and
   enter the non-volatile memory into the low power state based at least in part on receiving the second command.

9. The apparatus of claim 8, wherein the one or more controllers are configured to:
- exit the non-volatile memory from the low power state;
- perform second maintenance operations on the non-volatile memory after the non-volatile memory is exited from the low power state;
- transmit, to the host device, a second indication of a second state of maintenance operations of the non-volatile memory while the second maintenance operations are being performed on the non-volatile memory;
- receive a third command from the host device;
- receive, after a third duration from receiving the third command, a fourth command for entering into the low power state, wherein the third duration is based at least in part on the second state of maintenance operations of the non-volatile memory and is different than the first duration between the first command and the second command; and
- enter the non-volatile memory into the low power state based at least in part on receiving the fourth command.

10. The apparatus of claim 8, wherein the second command comprises a hibernate command.

11. The apparatus of claim 8, wherein the one or more controllers are configured to initiate performing the maintenance operations on the non-volatile memory based at least in part on failing to receive any further command for at least a third duration after receiving the first command, wherein the third duration is less than the first duration.

12. The apparatus of claim 8, wherein the maintenance operations comprise one or more of wear-leveling operations, garbage collection operations, error-correcting operations, encryption operations, caching operations, media management operations, background refresh operations, health monitoring operations, or address translations between logical addresses associated with commands from the host device and physical addresses of the non-volatile memory.

13. An apparatus, comprising:
- a non-volatile memory comprising one or more controllers, the one or more controllers configured to:
  - receive a command for the non-volatile memory to enter into a low power state;
  - change an operational mode of the non-volatile memory from a first mode to a second mode based at least in part on receiving the command for entering the non-volatile memory into the low power state;
  - transmit, to a host device for the non-volatile memory, an indication of a duration for performing one or more maintenance operations, the duration based at least in part on a quantity of one or more pending maintenance operations;
  - perform, during the duration, the one or more maintenance operations while in the second mode, the duration associated with an absence of commands received by the non-volatile memory; and
  - change the operational mode of the non-volatile memory from the second mode to a third mode after performing the one or more maintenance operations in accordance with the duration and based at least in part on receiving the command for entering the non-volatile memory into the low power state, wherein the third mode comprises the low power state.

14. The apparatus of claim 13, wherein the command comprises a hibernate command and wherein the one or more maintenance operations comprise one or more of wear-leveling operations, garbage collection operations, error-correcting operations, encryption operations, caching operations, media management operations, background refresh operations, health monitoring operations, or address translations between logical addresses associated with commands from the host device and physical addresses of the non-volatile memory.

15. The apparatus of claim 13, further comprising:
- delay changing the operational mode of the non-volatile memory from the second mode to the third mode before performing the one or more maintenance operations based at least in part on the quantity of pending maintenance operations satisfying a threshold.

* * * * *